United States Patent [19]
Lindberg et al.

[11] 3,971,661
[45] July 27, 1976

[54] FORMATION OF OPENINGS IN DIELECTRIC SHEET

[75] Inventors: Frank A. Lindberg, Baltimore; Stephen G. Konsowski, Glen Burnie; Maurice B. Shamash; Seymour J. Ponemone, both of Randallstown, all of Md.

[73] Assignee: Westinghouse Electric Corporation, Pittsburgh, Pa.

[22] Filed: Nov. 14, 1974

[21] Appl. No.: 523,946

Related U.S. Application Data

[63] Continuation of Ser. No. 262,871, June 14, 1972, abandoned.

[52] U.S. Cl. .................................. 96/36.2; 29/530; 156/3; 156/11; 156/18; 427/97; 427/99; 427/251
[51] Int. Cl.² ......................................... H01L 21/84
[58] Field of Search ........................ 29/530; 96/36.2; 427/251; 156/3, 8, 11, 18; 427/97, 99

[56] References Cited
UNITED STATES PATENTS

| | | | |
|---|---|---|---|
| 3,222,173 | 12/1965 | Belko, Jr. et al. | 96/36.2 |
| 3,311,966 | 4/1967 | Shaheen et al. | 156/3 |
| 3,620,815 | 11/1971 | Blecherman et al. | 427/251 |
| 3,672,986 | 6/1972 | Schneble, Jr. et al. | 156/8 |
| 3,679,500 | 7/1972 | Kubo et al. | 156/11 |
| 3,871,930 | 3/1975 | Fish | 156/3 |

*Primary Examiner*—William A. Powell
*Assistant Examiner*—Jerome W. Massie
*Attorney, Agent, or Firm*—H. W. Patterson

[57] ABSTRACT

There is disclosed a method for producing in thick (0.005 inches) polyimide films or sheets, openings, or windows across each of which an electrical conductor, such as copper or aluminum extends. The windows may be of substantial dimensions typically 0.05 inches by 0.1 inches. The conductor is of substantial thickness of about 0.0008 to 0.001 inches. The sheet is coated with the conductor on both surfaces by being rotated in a stream of vapor of the conductor produced by impinging an electron beam (typically at 10 KV and 300 milliamperes) on a block of the conducting material. Photoresist is then deposited on both coated surfaces of the sheet and exposed under masks and developed so as to expose the conducting coating on each surface in the areas of the windows. The exposed coating is then removed with an acid etchant while the remainder of the surfaces remain protected by the developed photoresist. The polyimide in the areas of the windows is thus exposed. The exposed polyimide is then removed by hydrazine leaving windows in each surface with conductors extending across the windows on the respective opposite surfaces.

6 Claims, 22 Drawing Figures

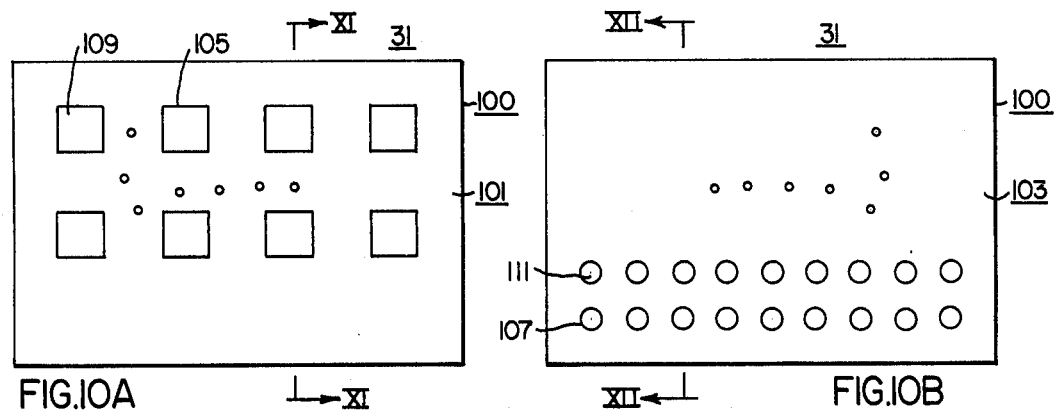
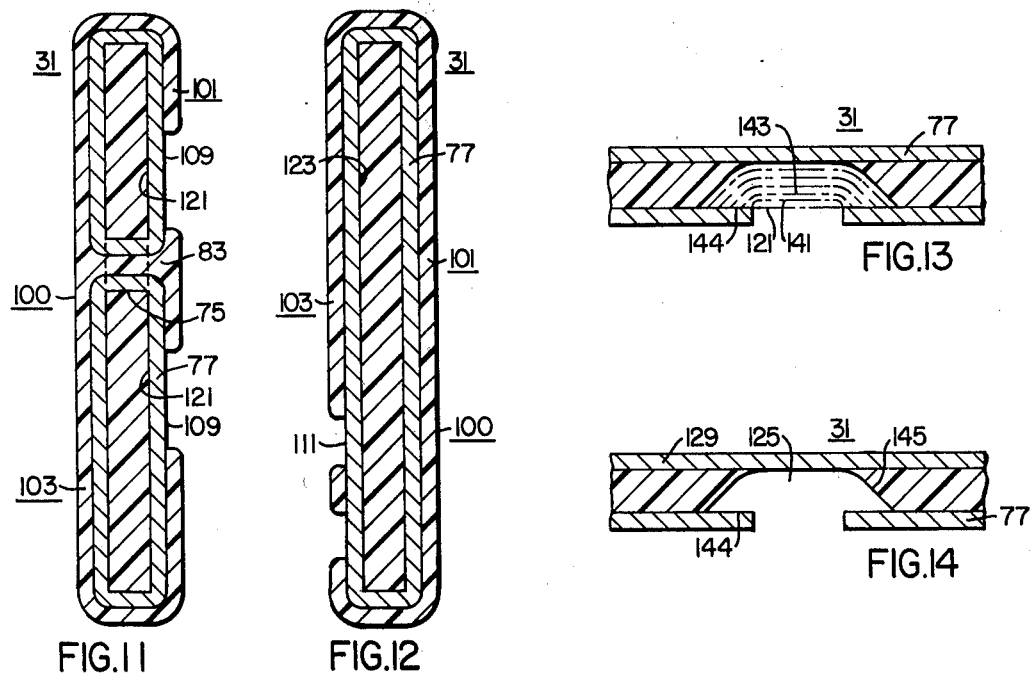
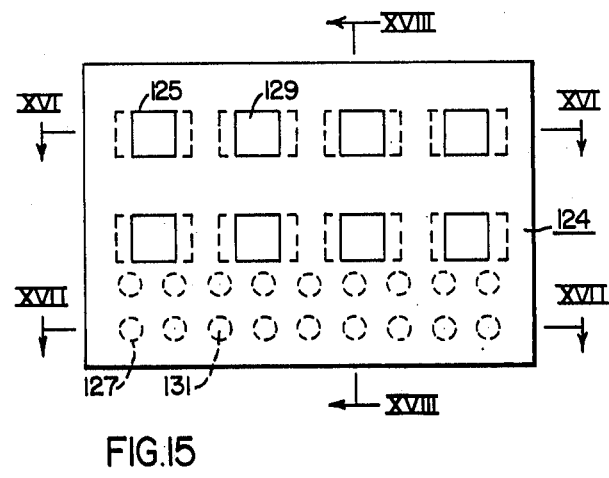

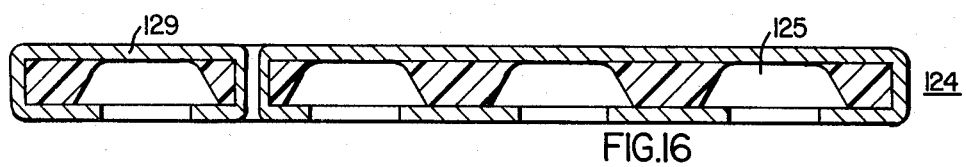
FIG.16
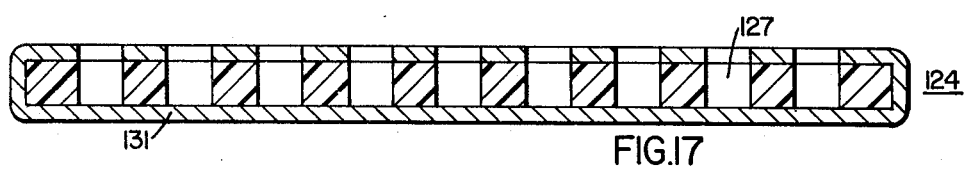
FIG.17
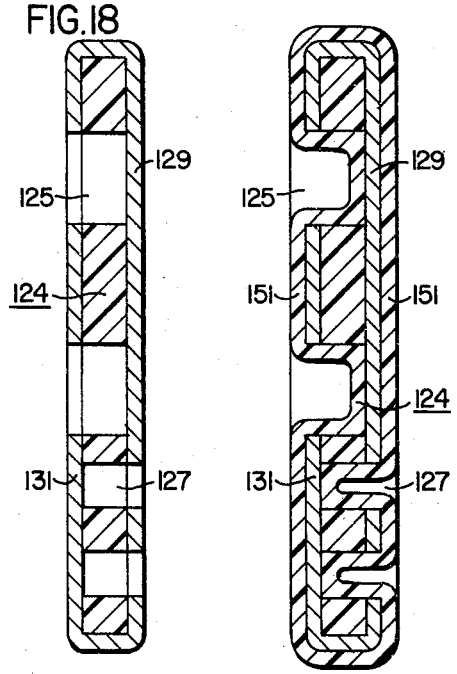
FIG.18
FIG.19
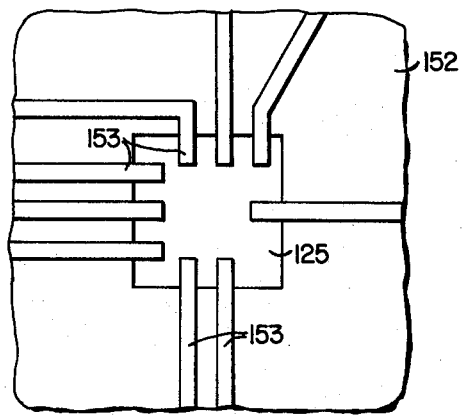
FIG.20

FORMATION OF OPENINGS IN DIELECTRIC SHEET

The invention herein described was made in the course of or under a subcontract thereunder with the Department Of The Navy.

CROSS REFERENCE TO RELATED DOCUMENTS

This is a continuation of application Ser. No. 262,871, filed June 14, 1972, now abandoned, U.S. Pat. No. 3,820,994 granted June 28, 1974 to F. A. Lindberg et al. for PENETRATION OF POLYIMIDE FILMS (herein called Lindberg patent) is incorporated herein by reference.

BACKGROUND OF THE INVENTION

This invention relates to the fabrication by etching or like processes of dielectric plates, sheets or films having electrical conductors selectively disposed on their surfaces and has particular relationship to such fabrication for the purpose of forming the insulators and conductors of functional solid-state circuit components. Lindberg patent discloses a method for producing perforated dielectric plates or sheets of substantial thickness, particularly of polyimide. The ultimate sheets produced are typically about 1½ inch square and the holes in these sheets are usually circular and typically about 0.005 inches in diameter. When these sheets form the base for circuit components, the holes serve for electrical connection between terminals on opposite surfaces of the sheet.

It is an object of this invention to convert sheets, such sheets as those created as taught by Lindberg patent or like sheets, to a form lending itself readily to the fabrication of solid-state circuit interconnection devices or modules. Such circuit interconnection devices or modules include chips (integrated circuits) and it is another object of this invention that, in the conversion of the sheets, they be adapted to receive and cooperate in the support of these chips, with backdown mounting of active devices for effective cooling, and to provide ready connections to the terminals of the chips and at the same time to provide the converted sheets with ready facilities for bonding to a substrate.

SUMMARY OF THE INVENTION

Solid-state circuit modules embodying sheets produced in the practice of this invention include a substrate of a ceramic, typically alumina or the like, on which the sheets and their chips are mounted. It has been realized in arriving at this invention that the chips can be mounted backdown on the substrate with their active sides accessible to the top or outer surface of the sheets through openings in the sheets. It has also been realized that the connections to the terminals of the sheets can be effected by cantilever conductors extending across the top of the sheets over the openings. For this purpose it is desirable that the conductors be of substantial thickness of the order of 0.0008 to 0.001 inches. In addition, the sheet includes an opening for joining the sheet to the substrate. It is another object of this invention to provide a sheet particularly suitable for integration into a solid-state module as described above.

In accordance with this invention there is provided, in a dielectric sheet, one or more openings or windows, each of which extends into one surface of the sheet and is bridged by an electrical conductor extending over the opposite surface. Both surfaces of the sheet are coated with an electrically conducting material such as copper or aluminum and a photoresist is deposited on the coating, preferably on both surfaces. The photoresist is then imaged on each surface to define the openings. The imaging for each opening is only on the surface into which the opening is to penetrate and not on the opposite surface. Development of the photoresist exposes the conductor in the area of the opening. This conductor is etched by an acid etchant which is resisted by the developed photoresist on the remainder of the sheet. The dielectric in the area is thus exposed. This dielectric is etched by an etchant, typically hydrazine for polyimide, which is resisted by the conductor. The developed photoresist may be stripped by the hydrazine or other suitable stripper. A window is thus produced on one surface with a conductor across it on the opposite surface. The conductor may now be coated with photoresist and imaged and acid etched to produce cantilever strips for connection to the terminals of a chip extending into the opening.

The manner in which the dielectric sheet is coated with a thick conducting coating constitutes a feature of this invention. In accordance with the teaching of the prior art the conducting material is vaporized by joule heating. In attempting to use joule heating for depositing a conducting coating formidable difficulties are that the time of deposit even for a thin coating is excessively long, consuming hours, and the desired thickness cannot be achieved even for deposit over a long time interval. Typically, for aluminum, the maximum thickness achieved is no greater than 0.0003 inches. In accordance with this invention the coating vapor is produced by impinging an electron beam, of relatively high energy, on the coating material. Typically the beam current may be 300 milliamps at 10,000 volts, producing a viscous cloud of vapor. The vapor streams above the cloud are linear. The sheet is rotated in the linear flow region and is readily coated to the required thickness. Aluminum can be deposited to a thickness of 0.0008 to 0.001 inches in less than 1 hour.

An additional advantage of the vaporization by an electron beam is that the vapor has high purity, is about 99.99% pure. Another, and very important, advantage is that as the sheet is rotated the walls of the holes in the sheet are coated to about the same thickness as, or somewhat higher thickness than, the surfaces about the holes.

BRIEF DESCRIPTION OF THE DRAWINGS

For a better understanding of this invention both as to its organization and as to its method of operation, together with additional objects and advantages thereof, reference is made to the following description taken in connection with the accompanying drawings, in which:

FIGS. 10A and 10B are plan views of the bottom and top of a sheet imaged with the masks shown in FIGS. 9A and 9B;

FIG. 11 is a view in section enlarged, taken along line XI—XI of FIG. 10A;

FIG. 12 is a view in section enlarged, taken along line XII—XII of FIG. 10B;

FIGS. 13 and 14 are fragmental sectional views enlarged showing the manner in which the dielectric is etched in the practice of this invention;

FIG. 15 is a plan view looking towards the bottom of a sheet processed in accordance with this invention;

FIGS. 16 and 17 are views in section enlarged, taken along lines XVI—XVI and XVII—XVII respectively of FIG. 15;

FIG. 18 is a view in section enlarged, taken along lines XVIII—XVIII of FIG. 15;

FIG. 19 is a view in section enlarged of sheet similar to FIG. 18 but showing the manner in which the sheet is prepared for etching of conductor patterns; and FIG. 20 is a portion of the sheet shown in FIG. 19 after processing to produce the cantilever conductors.

DETAILED DESCRIPTION OF INVENTION

Figure 1:
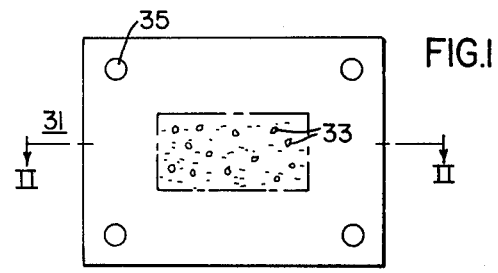
FIG. 1 is a plan view of a sheet or plate which was processed as disclosed in Lindberg patent and which serves as a blank to be converted, in the practice of this invention, to a form lending itself readily to use as a base for a solid-state circuit component interconnection.
Figure 2:
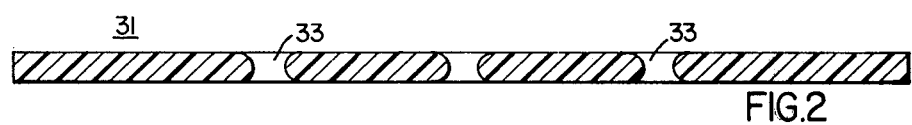
FIG. 2 is a view in section enlarged taken along line II—II of FIG. 1.

FIGS. 1 and 2 show a sheet, plate, or film 31 of a dielectric material such as a polyimide. This sheet 31 was processed as disclosed in Lindberg patent and includes a plurality of small holes 33, produced by the process of Lindberg patent, and punched holes 35 in the corners. Typically the sheet 31 is about 5 mils thick. Preparatory to being coated with an electrical conductor the sheet 31 is cleaned in ALCONOX solutions and vapor degreased in trichlorethylene.

Figure 3:
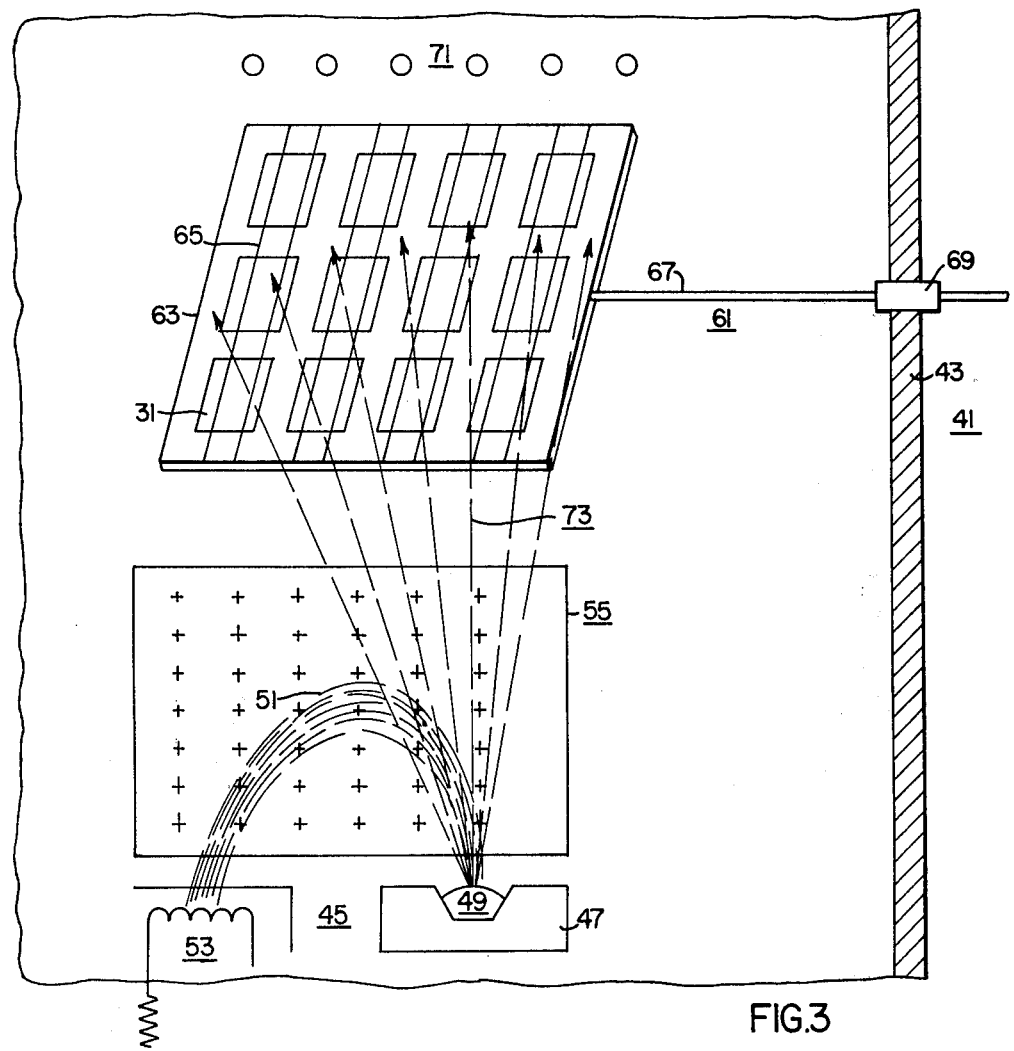
FIG. 3 is a diagrammatic view showing apparatus for coating both surfaces of the sheet shown in FIGS. 1 and 2 with an electrically-conducting material.

The apparatus shown in FIG. 3 includes a vacuum chamber 41. Typically the chamber 41 may be a cylindrical bell jar of about 26 inch diameter. FIG. 3 shows only a part of the wall 43 of this bell jar. When in use in a coating operation the jar is continuously pumped, typically, by a 10-inch diameter NRC oil-diffusion pump with a liquid-nitrogen trap and back pumped by a 60 CFM Kinney rotary piston mechanical pump.

Within the chamber 41 there is an electron-beam heated vapor source 45, typically sold be Temescal. This source 45 includes a water-cooled hearth 47 containing a mass 49 of the coating material, which is usually aluminum but may be copper. The mass 49 is vaporized by an electron beam 51 derived from a cathode 53; the beam is deflected to the mass 49 by a magnetic field produced by a magnet 55 (only a pole shown). Typically the electron-beam power source 45 is powered by a 10 KV, 10 KW Temescal electron-beam power supply (CV-10-210) (not shown).

The coating apparatus also includes a coating fixture 61 having a frame 63 on which sheets 31 are suspended by wires 65. The frame 63 is rotatably suspended from a shaft 67 which passes through a seal 69 in the wall 43. Above the frame 63 there is a quartz heater 71. The chamber 41 is pumped down to about $1 \times 10^{-6}$ torr to $5 \times 10^{-7}$ torr while the heater is energized. At this low pressure the electron-beam generator is energized.

The electron-beam current is typically about 300 milliamps. A large proportion (about 90%) of the beam energy is absorbed by the cooling water but the remainder vaporizes the mass 49. The vapor forms a viscous cloud above the molten pool of metal about the size of a baseball with the molten metal forming a spot at the center. Above this cloud the molecules travel in straight lines 73. The center of the frame 63 is typically spaced about six inches from the spot. The frame 63 is rotated and the sheets 31 suspended on it are bathed in the vapor and coated. The heater 71 is typically a 500-watt quartz heater and is typically about 2½ inches above the upper edge of frame 63 when the frame is in the vertical position. A film thickness monitor, typically, Granville Phillips Series 219 (a quartz crystal whose frequency is changed by deposit), (not shown) is mounted in the vapor stream 73.

Figure 4:
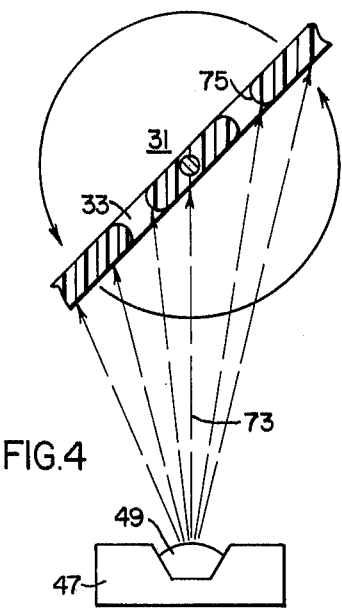
FIG. 4 is a fragmental diagrammatic view derived from FIG. 3 for aiding in the understanding of the coating process showing particularly how the walls of the holes are coated.

As the frame is rotated in the stream 73 the surfaces of the sheet 31 including the walls 75 of the holes are coated. The manner in which the vapor penetrates onto the walls 75 is shown in FIG. 4. In the inclined positions of the sheet 31 the walls 75 are in the path of the vapor.

Figure 5:
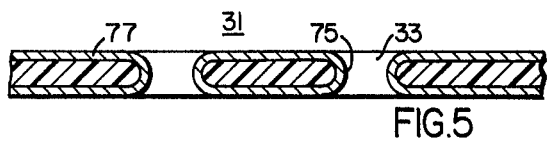
FIG. 5 is a view in section of a fragment of the sheet coated with the apparatus shown in FIGS. 3 and 4.
Figure 6:
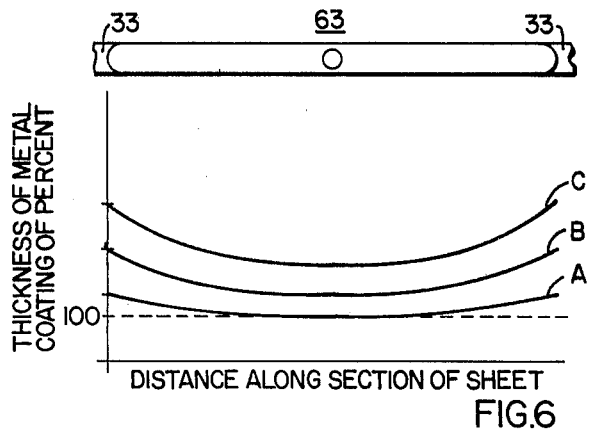
FIG. 6 is a graph showing the distribution of the conducting coating across the surface of the rotating frame of FIGS. 3 and 4.

A fragment of a sheet 31 having coating 77 is shown in FIG. 5. Actually the coating on the walls 75 is somewhat thicker than the coating on the plane surfaces of the sheet 31, if the hole is near the edge of the rotating frame 63. The thickness distribution across the surface of the rotating frame 63 is shown in FIG. 6 in which thickness in percent is plotted vertically and distance along the frame 63 horizontally. The curves A, B, C are plotted for different spacing of the frame 63 from the source 49, curve A corresponding to the greatest spacing and curve C to the smallest spacing. The thickness of the coating 77 increases near the edges of the frame 63 being about 108% at the edge of the frame 63 for the greatest spacing.

Figure 7:
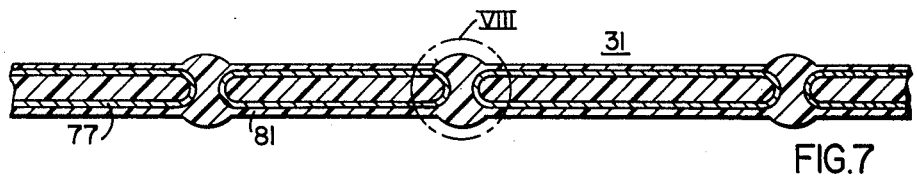
FIG. 7 is a view in section showing a sheet coated with a conductor and having a photoresist coating on the conducting surfaces.
Figure 8:
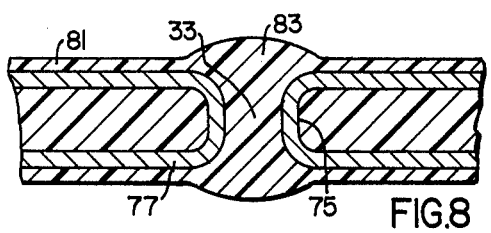
FIG. 8 is an enlarged view of the portion of the plate of FIG. 7 in circle VIII.

The sheet 31 having coating 77 is next provided with a photoresist coating 81 (FIGS. 7 and 8). The coating 81 may be negative or positive and is typically KTFR negative. The holes 33 are filled with photoresist plugs 83 which serve to protect the metal coating 77 on the walls 75.

Figure 9A:
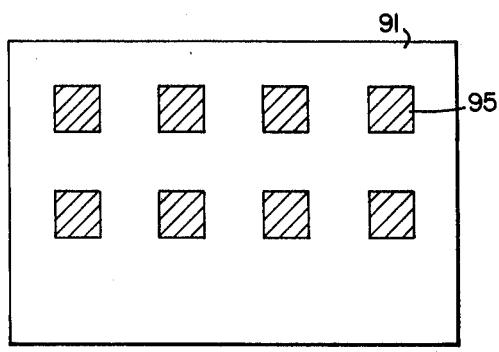
FIGS. 9A and 9B are plan views of the imaging masks for the bottom and top respectively of the sheet shown in FIGS. 7 and 8.
Figure 9B:
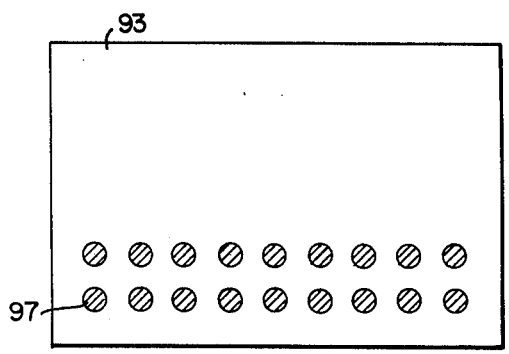

The photoresist coatings 81 on both faces of sheet 31 are exposed through masks 91 and 93 (FIGS. 9A and 9B). Masks 91 and 93 are composed of MYLAR composition. The mask 91 is for the bottom surface of the sheet 31 and is transparent except for rectangular opaque areas 95. The mask 93 is for the top surface of the sheet 31 and is transparent except for the two rows of circular areas 97. The masks are produced by coating sheets of MYLAR composition with photographic emulsion and exposing the emulsion and then developing the exposed emulsion. The masks 91 and 93 are congruent to the sheet 31 and are placed on the respective surfaces of the sheet 31 with the imaged surfaces abutting the photoresist 81 on the respective surfaces of the sheet 31. It is essential that the opaque areas 95 and 97 be precisely located and that the sheets 91 and 93 be positioned in precise congruence with the sheet 31.

Following the developing of exposed sheet 31 an intermediate processed sheet 100 is produced (FIGS. 10A and 10B). The surfaces 101 and 103 are opaque except for the areas 105 and 107 which are transparent exposing the conducting material 109 and 111 (FIGS. 11 and 12) in these areas. The processed sheet 100 is then submerged in an acid bath which for aluminum coating is composed of $H_3PO_4$, $CH_3COOH$, and $HNO_3$ in the proportions disclosed in Lindberg patent. The exposed conducting material 109 and 111 is etched exposing the dielectric surfaces 121 and 123 under the surfaces 109 and 111. The coating on the walls 75 is protected by the plugs 83 of photoresist. The dielectric under the exposed surfaces 121 and 123 is then etched with hydrazine for polyimide and the developed photo-resist is removed producing a processed sheet 124 (FIGS. 16–19) with openings 125 and 127 into the surfaces 103 and 101 respectively (FIGS. 15 through 18). The etching is carried out by submerging the intermediate-processed sheet in a bath of the etchant so that all regions are simultaneously etched. The etching of the windows 125, which to accomodate chips, are about $0.05 \times 0.1$ inches, is accomplished in about 35 to 40 seconds. The 5 mil holes (Lindberg patent) were etched in about 15 to 20 seconds. The openings 125 and 127 (FIGS. 16–19) are subtended by conducting material 129 and 131 respectively.

In etching the dielectric the exposed surfaces 121 and 123 are first etched away as represented by the line 141 in FIG. 13. Then the newly exposed surface is etched as represented by the line 143 and the etching continues from exposed surface to exposed surface. The conductor 77 at the openings 125 and 127 are thus undercut at 144 as shown in FIGS. 13 and 14 and the walls of the openings are tapered.

The sheets 124 may be further processed to produce the desired conductor pattern. For this purpose the sheet 124 is again coated with a photoresist coating 151 (FIG. 19). The coating 151 penetrates into the openings 125 and 127, coating the walls of these openings. The coated sheet 124 is then exposed under a mask corresponding to the desired pattern and is developed and etched with an acid etchant to produce the conductor pattern. A portion of a typical processed sheet 152 is shown in FIG. 20. The conductor 129 is converted by the last processing into a plurality of cantilevers 153 extending over opening 125. These conductors may be connected to pads of a chip (not shown) extending into the opening. The openings 127 serve for bonding the sheet 152 to a substrate. Typically the bonding is effected by thermocompression or ultrasonic welding of the conductor 131 to the metallized alumina substrate. The cantilevers 153 are of substantial thickness so that they can be bent to avoid contact with chip conductors.

While a preferred embodiment of, and preferred mode of practicing, this invention have been disclosed herein, modifications thereof are feasible. This invention is not to be restricted except insofar as is necessitated by the spirit of the prior art.

We claim:
1. The method of producing in a dielectric sheet at least a first opening in one surface thereof subtended by a metal cover on the opposite surface thereof and at least a second opening in said opposite surface of said sheet subtended by a metal cover on said one surface thereof, said openings being displaced from each other along said sheet, the said method comprising, depositing a coating of metal directly on both said surfaces of said sheet, depositing a photo-resist coating on each of said coatings of metal, producing images respectively on each of said photo-resist coatings, processing said images to remove photo-resist coating from each of said surfaces selectively as determined by said images, the image on the photo-resist coating on said one surface defining the area of said first opening, and the processing of said images exposing to etching only the metal in said last-named area, the image on the photo-resist coating on said opposite surface defining the area of said second opening, and the processing of said images exposing to etching only the metal in said last-named area, the image of said photo-resist coating on said one surface also defining the metal on said one surface which last-named metal subtends said exposed metal on said opposite surface and the processing of said images leaving said subtending metal protected from etching by photo-resist coating, and the image of said photo-resist coating on said opposite surface also defining the metal on said opposite surface which last-named metal subtends said exposed metal on said one surface, and the processing of said images leaving said last-named subtending metal protected from etching by photo-resist coating, subjecting the said imaged and processed sheet as a whole in a single operation to a first etchant to etch both the exposed metal in the area of said first opening and the exposed metal in the area of said second opening, said etchant etching only said last-named metals thereby exposing unetched the dielectric materials in said areas, said subtending metal on said one surface and said subtending metal on said opposite surface remaining protected against etching respectively by said imaged and processed photo-resist coating on said one surface and by said imaged and processed photo-resist coating on said opposite surface, and, respectively, by said exposed dielectric material in said area on said opposite surface and by said exposed dielectric material in said area in said one surface, etching both said dielectric material in said area on said one surface and said dielectric material in said area on said opposite surface in a single operation with a second etchant to which the metal is resistant and which etches only said last-named dielectric material and removing the residual photo-resist remaining after said imaging and processing from both said surfaces, thereby providing first and second openings respectively in said one surface and said opposite surface, each opening subtended by a metal cover respectively in said opposite surface and said one surface.

2. The method of claim 1 wherein the images on both surfaces are produced by exposing each photo-resist coating to a mask which is congruent to the sheet and in which the areas of the first and second openings are precisely defined.

3. The method of claim 1 wherein the etching of the exposed conducting material in both surfaces is carried out in a single operation by submerging the sheet, coated and imaged as recited in claim 1, in the first etchant.

4. The method of claim 1 wherein the etching of the exposed dielectric material in both surfaces is carried out in a single operation by submerging the dielectric plate, coated, imaged and etched, as recited in claim 1, in the second etchant.

5. The method of claim 1 wherein the etching of the exposed metal in both surfaces is carried out in a single operation by submerging the sheet, coated and imaged as recited in claim 1, in the first etchant and thereafter submerging the resulting sheet in the second etchant.

6. The method of claim 1 wherein the dielectric sheet is composed of a polyimide and the metal of one of the class consisting of copper and aluminum, and the metal is etched by an acid etchant which does not dissolve the polyimide and the photoresist coating about the exposed metal, and the polyimide is etched by hydrazine.

* * * * *